United States Patent
Lee et al.

(10) Patent No.: US 7,113,440 B2
(45) Date of Patent: Sep. 26, 2006

(54) SEMICONDUCTOR MEMORY DEVICE SAVING POWER DURING SELF REFRESH OPERATION

(75) Inventors: Kang-Seol Lee, Ichon-shi (KR); Jae-Jin Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 52 days.

(21) Appl. No.: 10/877,555

(22) Filed: Jun. 24, 2004

(65) Prior Publication Data

US 2005/0141310 A1    Jun. 30, 2005

(30) Foreign Application Priority Data

Dec. 29, 2003    (TW) .................... 10-2003-0098443

(51) Int. Cl.
*G11C 7/00*    (2006.01)
(52) U.S. Cl. .................... 365/222; 365/226; 365/191; 365/189.09
(58) Field of Classification Search ................ 365/222, 365/226, 191
See application file for complete search history.

(56) References Cited

U.S. PATENT DOCUMENTS

| 6,002,629 | A | * | 12/1999 | Kim et al. | 365/222 |
| 6,137,743 | A | * | 10/2000 | Kim | 365/222 |
| 6,147,927 | A | * | 11/2000 | Ooishi | 365/233 |
| 6,597,614 | B1 | * | 7/2003 | Nam et al. | 365/222 |
| 6,611,472 | B1 | * | 8/2003 | Kitamoto et al. | 365/227 |
| 6,693,838 | B1 | * | 2/2004 | Hagura et al. | 365/222 |

* cited by examiner

*Primary Examiner*—Huan Hoang
(74) *Attorney, Agent, or Firm*—Blakely Sokoloff Taylor & Zafman

(57) ABSTRACT

A semiconductor memory device includes: a self refresh request signal generation unit which receives a self refresh signal for generating a base periodic signal, a plurality of divided signals and a self refresh request signal; an internal voltage generation control signal generation unit for generating an internal voltage generation control signal in response to the plurality of divided signals; and an internal voltage generation unit for generating an internal voltage in response to the internal voltage generation control signal.

13 Claims, 4 Drawing Sheets

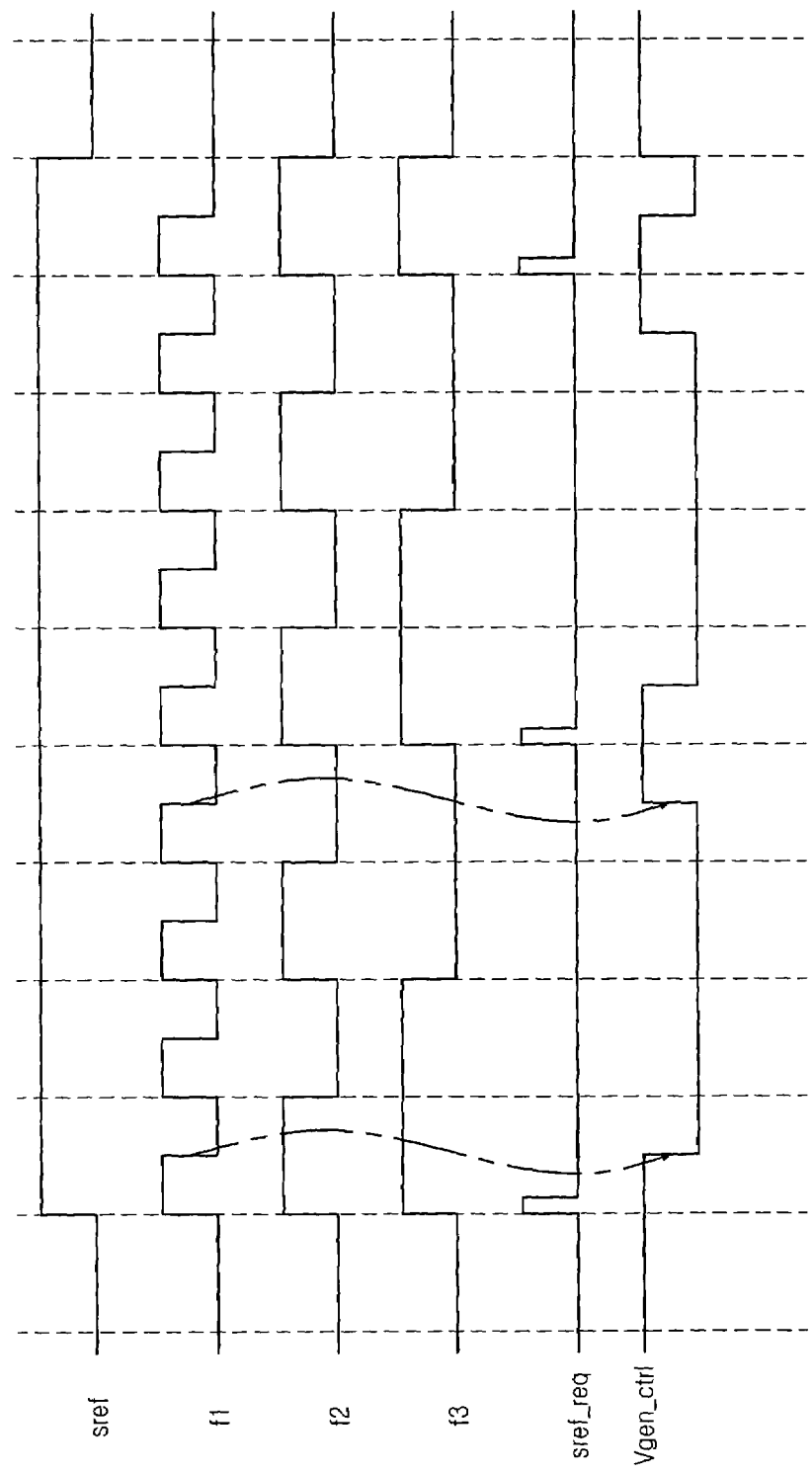

SEMICONDUCTOR MEMORY DEVICE SAVING POWER DURING SELF REFRESH OPERATION

FIELD OF INVENTION

The present invention relates to a semiconductor memory device; and, more particularly, to a semiconductor memory device capable of saving power during self refresh operation.

DESCRIPTION OF PRIOR ART

Generally, an operational power supply voltage for a semiconductor memory device becomes low and low as circuits included in the semiconductor memory device are more integrated and require less power.

In case of a dynamic random access memory (DRAM), various internal power supply voltages such as a core voltage Vcore, a high voltage Vpp, a back-biased voltage Vbb, a bit line precharge voltage Vblp and a cell plate voltage Vcp should be generated in the DRAM.

Therefore, the DRAM includes an internal power generation circuit to generate the various internal power supply voltages.

The internal power generation circuit generates the core voltage Vcore and a peri voltage Vperi by using a reference voltage Vref and also generates the high voltage Vpp, the back-biased voltage Vbb, the bit line precharge voltage Vblp and the cell plate voltage Vcp by using the core voltage Vcore.

Meanwhile, a memory cell included in the DRAM is formed by a transistor and a capacitor, and the capacitor has to be charged or discharged for the DRAM operation. However, charge quantity stored in the capacitor reduces as time passes. Therefore, the memory cell included the DRAM must be refreshed periodically in order to hold its data contents. A retention time is a maximum time the memory cell can hold its data without the refresh operation.

The refresh operation is performed at least once within the retention time by selecting a word line and rewriting data into memory cells of the word line after amplifying the data. Every word line included in the DRAM is selected by increasing an internal address generated by an address counter so that all the memory cells included in the DRAM can be refreshed.

There are two different refresh operations depending on a mode of the DRAM operation: one is an auto refresh operation, and the other is a self refresh operation. The self refresh operation is performed when the DRAM is not in a normal mode, i.e., the DRAM does not perform a data access operation. The auto refresh operation, however, is performed when the DRAM is in the normal mode.

In the self refresh operation, an active/precharge operation should be performed to a word line which corresponds to an internal address in response to a self refresh request signal. Herein, the self refresh request signal is a pulse signal which pulses periodically during the self refresh operation, and the active/precharge operation is performed at every pulse of the self refresh request signal.

As mentioned above, since the DRAM does not perform the data access operation during the self refresh operation, the various internal power supply voltages are not needed except for the active/precharge operation. However, the various internal power supply voltages are continuously generated during the self refresh operation. As a result, the DRAM wastes power during the self refresh operation.

SUMMARY OF INVENTION

It is, therefore, an object of the present invention to provide a semiconductor memory device capable of saving power during self refresh operation.

In accordance with an aspect of the present invention, there is provided a semiconductor memory device includes: a self refresh request signal generation unit which receives a self refresh signal for generating a base periodic signal, a plurality of divided signals and a self refresh request signal; an internal voltage generation control signal generation unit for generating an internal voltage generation control signal in response to the plurality of divided signals; and an internal voltage generation unit for generating an internal voltage in response to the internal voltage generation control signal.

BRIEF DESCRIPTION OF THE DRAWINGS

The above and other objects and features of the present invention will become apparent from the following description of preferred embodiments taken in conjunction with the accompanying drawings, in which:

FIG. 5 is a timing diagram showing an operation of a semiconductor memory device shown in FIG. 1.

DETAILED DESCRIPTION OF INVENTION

Hereinafter, a semiconductor memory device in accordance with the present invention will be described in detail referring to the accompanying drawings.

Figure 1:
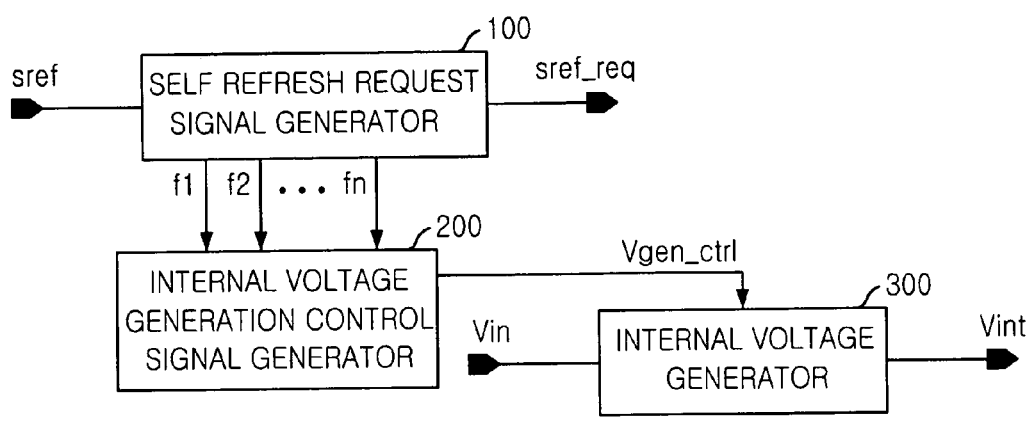
FIG. 1 is a block diagram showing a semiconductor memory device in accordance with a preferred embodiment of the present invention.

FIG. 1 is a block diagram showing a semiconductor memory device in accordance with a preferred embodiment of the present invention.

As shown, the semiconductor memory device includes a self refresh request signal generator 100, an internal voltage generation control signal generator 200 and an internal voltage generator 300.

The self refresh request signal generator 100 receives a self refresh signal sref for generating a base periodic signal f1 and a plurality of divided signals f2 to fn, where the n of fn is a natural number greater than 2. The self refresh request signal generator 100 also generates a self refresh request signal sref_req in response to the base period signal f1 and the plurality of divided signals f2 to fn.

The internal voltage generation control signal generator 200 serves to generate an internal voltage generation control signal Vgen_ctrl in response to the base periodic signal f1 and the plurality of divided signals f2 to fn.

The internal voltage generator 300 generates an internal voltage Vint by using an input voltage Vin in response to the internal voltage generation control signal Vgen_ctrl. The internal voltage generator 300 is enabled or disabled by the internal voltage generation control signal Vgen_ctrl. That is, if the internal voltage generation control signal Vgen_ctrl is activated as a logic high level, the internal voltage generator 300 is enabled. On the other hand, if the internal voltage generation control signal Vgen_ctrl is inactivated as a logic low level, the internal voltage generator 300 is disabled. Herein, a reference voltage Vref or a core voltage Vcore can be used as the input voltage Vin.

Figure 2:
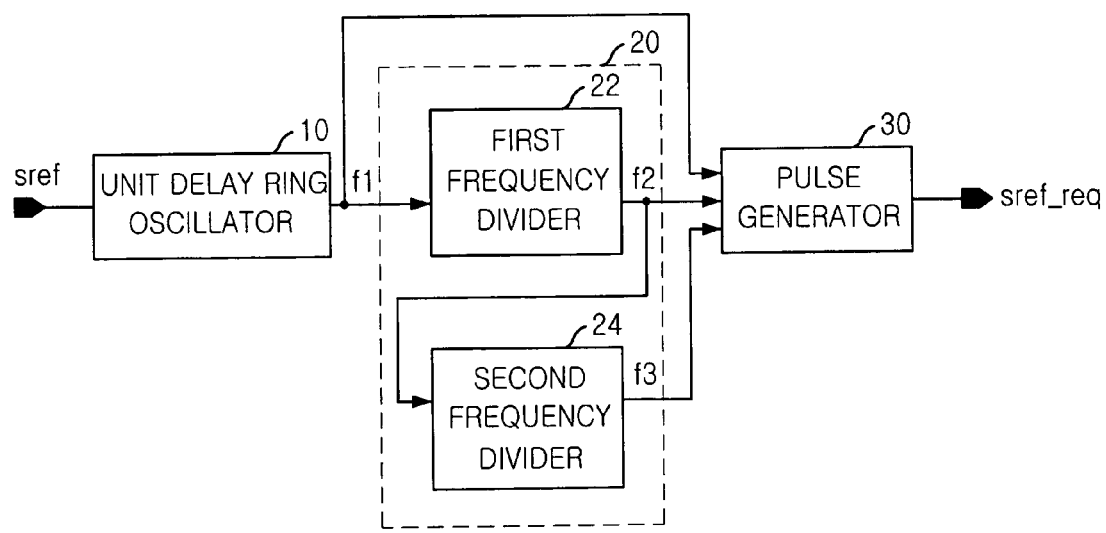
FIG. 2 is a block diagram showing a self refresh request signal generator shown in FIG. 1.

FIG. 2 is a block diagram showing the self refresh request signal generator 100 shown in FIG. 1.

As shown, the self refresh request signal generator 100 includes a unit delay ring oscillator 10, a frequency division unit 20 and a pulse generator 30.

The unit delay ring oscillator 10 receives the self refresh signal sref for generating the base periodic signal f1.

The frequency division unit 20 receives the base periodic signal f1 for generating a first and a second divided signals f2 and f3 by increasing a period of the base periodic signal f1. Hereinafter, it is assumed that the self refresh request signal generator 100 generates two divided signals, i.e., the first and the second divided signals f2 and f3. Undoubtedly, the self refresh request signal generator 100 can generate more than two divided signals.

The pulse generator 30 receives the base periodic signal f1 and the first and the second divided signals f2 and f3 in order to generate the self refresh request signal sref_req which periodically pulses.

Herein, the frequency division unit 20 includes a first frequency divider 22 and a second frequency divider 24.

The first frequency divider 22 receives the base periodic signal f1 and generates the first divided signal f2 by doubling a period of the base periodic signal f1. That is, the first divided signal f2 has a same waveform as that of the base periodic signal f1, and a period of the first divided signal f2 is two times longer than that of the base periodic signal f1.

Likewise, the second frequency divider 24 receives the first divided signal f2 and generates the second divided signal f3 by doubling a period of the first divided signal f2. That is, the second divided signal f3 has a same waveform as that of the first divided signal f2, and a period of the second divided signal f3 is two times longer than that of the first divided signal f2. In other words, the second divided signal f3 has a same waveform as that of the base periodic signal f1, and a period of the second divided signal f3 is four times longer than that of the base periodic signal f1.

Figure 3:
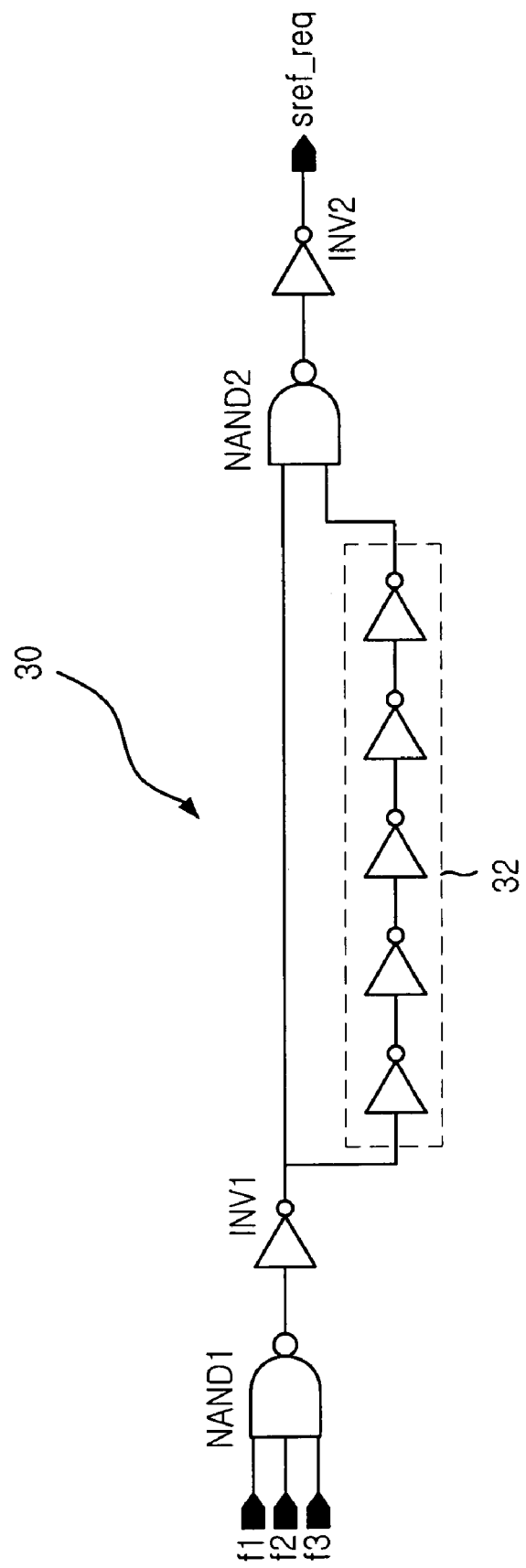
FIG. 3 is a schematic circuit diagram showing a pulse generator shown in FIG. 2.

FIG. 3 is a schematic circuit diagram showing the pulse generator 30 shown in FIG. 2.

As shown, the pulse generator 30 includes a first NAND gate NAND1, a first inverter INV1, a second NAND gate NAND2, a second inverter INV2 and a delay unit 32.

The first NAND gate NAND1 receives the base periodic signal f1 and the first and the second divided signals f2 and f3 in order to perform a logic NAND operation to the received signals. The first inverter INV1 receives an output signal of the first NAND gate NAND1 and inverts the received signal.

The delay unit 32 which includes a plurality of inverters receives an output signal of the first inverter INV1 and delays the received signal for a predetermined delay time. Herein, the delay unit 32 includes odd numbers of inverters.

The second NAND gate NAND2 receives output signals of the first inverter INV1 and the delay unit 32 for performing a logic NAND operation to the received signals, and the second inverter INV2 receives an output signal of the second NAND gate NAND2 in order to output the output signal of the second NAND gate NAND2 as the self refresh request signal sref_req after inverting the output signal of the second NAND gate NAND2.

Figure 4:
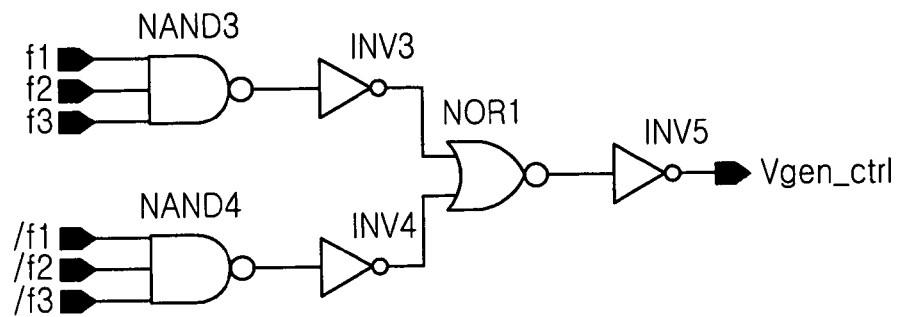
FIG. 4 is a schematic circuit diagram showing an internal voltage generation control signal generator shown in FIG. 1.

FIG. 4 is a schematic circuit diagram showing the internal voltage generation control signal generator 200 shown in FIG. 1.

As shown, the internal voltage generation control signal generator 200 includes a third NAND gate NAND3, a fourth NAND gate NAND4, a NOR gate NOR1 and a third to a fifth inverters INV3 to INV5.

The third NAND gate NAND3 receives the base periodic signal f1 and the first and the second divided signals f2 and f3 to perform a logic NAND operation to the received signals. Likewise, the fourth NAND gate receives inverted signals of the base period signal f1 and the first and the second divided signals f2 and f3 to perform a logic NAND operation to the received signals.

The third and the fourth inverters receive output signals of the third and the fourth NAND gates NAND3 and NAND4 respectively.

The NOR gate NOR1 receives output signals of the third and the fourth inverters INV3 and INV4 in order to perform a logic NOR operation to the received signals, and the fifth inverter INV5 receives an output signal of the NOR gate NOR1 in order to output the output signal of the NOR gate NOR1 as the internal voltage generation control signal Vgen_ctrl after inverting the output signal of the NOR gate NOR1.

FIG. 5 is a timing diagram showing an operation of the semiconductor memory device shown in FIG. 1.

Referring to FIGS. 1 to 5, the operation of the semiconductor memory device is described below.

If a self refresh command signal is inputted, the self refresh signal sref is activated as a logic high level.

Thereafter, the unit delay ring oscillator 10 generates the base periodic signal f1 in response to the self refresh signal sref. Then, the first frequency divider 22 generates the first divided signal f2 by doubling a period of the base periodic signal f1, and the second frequency dividers 24 generates the second divided signal f3 by doubling a period of the first divided signal f2.

Thereafter, the pulse generator 30 generates the self refresh request signal sref_req which pulses at a rising edge of the second divided signal f3. That is, the self refresh request signal sref_req pulses at every four cycles of the base periodic signal f1. An active/precharge operation for performing the self refresh operation is performed at every pulse of the self refresh request signal sref_req.

Meanwhile, particularly, an operation of the internal voltage generation control signal generator 200 is described below.

Before the self refresh signal sref is activated as a logic high level, i.e., when the self refresh signal sref is in a logic low level, all of the base periodic signal f1 and the first and the second divided signals f2 and f3 are in a logic low level. As a result, the internal voltage generation control signal Vgen_ctrl is in a logic high level.

Thereafter, if the self refresh signal sref is activated as a logic high level, the internal voltage generation control signal Vgen_ctrl becomes in a logic low level after a half cycle of the base periodic signal f1, i.e., at a falling edge of the base periodic signal f1 as shown in FIG. 5.

Then, the internal voltage generation control signal Vgen_ctrl keeps its logic low level while the base periodic signal f1 and the first and the second divided signals f2 and f3 are not in a same logic level.

Thereafter, if all of the base periodic signal f1 and the first and the second divided signals f2 and f3 become in a logic low level, the internal voltage generation control signal Vgen_ctrl is activated as a logic high level as shown in FIG. 5. Then, after one cycle of the base periodic signal f1, the internal voltage generation control signal Vgen_ctrl becomes in a logic low level. Herein, when the internal voltage generation control signal Vgen_ctrl is activated as a logic high level, the self refresh request signal sref_req pulses at a rising edge of the base periodic signal f1.

As a result, since the above-mentioned operation is periodically performed while the self refresh signal sref is in a logic high level, the internal voltage generation control signal Vgen_ctrl is in a logic high level for a half cycle of the base periodic signal f1 before the self refresh request signal sref_req pulses and also for a half cycle of the base periodic signal f1 after the self refresh request signal sref_req pulses.

Meanwhile, if the self refresh signal sref becomes in a logic low level, the base periodic signal f1 and the first and the second divided signals f2 and f3 become in a logic low level, and, thus, the internal voltage generation control signal Vgen_ctrl is activated as a logic high level.

Therefore, since the internal voltage generation control signal Vgen_ctrl is activated only when the self refresh request signal sref_req pulses, i.e., when the active/precharge operation is performed, the internal voltage generator 300 is disabled while the active/precharge operation is not performed. As a result, the semiconductor memory device in accordance with the present invention can save power during the self refresh operation.

The internal voltage generator 300 can be various internal voltage generators for generating various internal voltages such as a core voltage Vcore and a high voltage Vpp.

Figure 6:
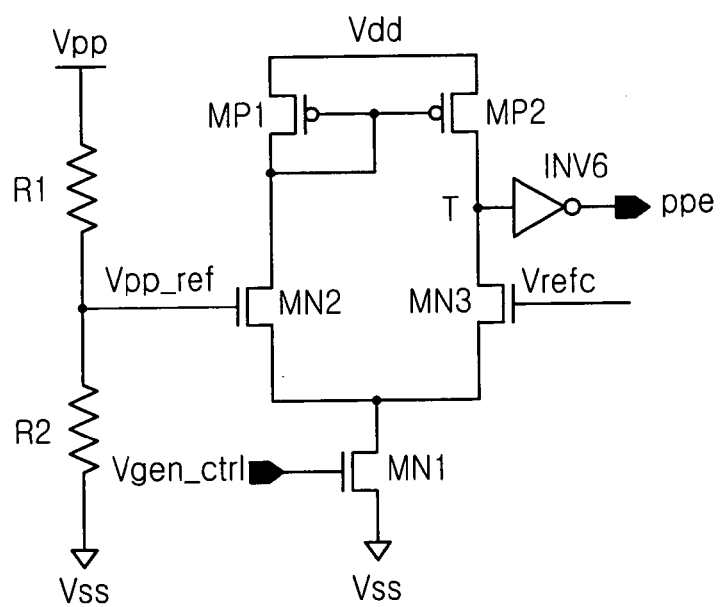
FIG. 6 is a schematic circuit diagram showing a high voltage detector included in a high voltage generator.

FIG. 6 is a schematic circuit diagram showing a high voltage detector included in a high voltage generator. The high voltage detector is one of various circuits where the internal voltage generation control signal Vgen_ctrl can be employed to be used as an enable signal.

As shown, the high voltage detector includes a first resistor R1, a second resistor R2, a first p-channel metal oxide semiconductor (PMOS) transistor MP1, a second PMOS transistor MP2, a sixth inverter INV6 and a first to a third n-channel metal oxide semiconductor (NMOS) transistors MN1 to MN3.

The first and the second resistors R1 and R2 are connected in series between the high voltage Vpp and a ground voltage Vss, and a high voltage reference voltage Vpp_ref is outputted from a node between the first resistor R1 and the second resistor R2.

The second and the third NMOS transistors MN2 and MN3 respectively receive the high voltage reference voltage Vpp_ref and a core voltage reference voltage Vrefc through their gates.

The first NMOS transistor MN1 is connected between the ground voltage Vss and sources of the second and the third NMOS transistors MN2 and MN3. A gate of the first NMOS transistor MN1 receives the internal voltage generation control signal Vgen_ctrl.

The first and the second PMOS transistors MP1 and MP2 serve to mirror currents flown on the second NMOS transistor MN2 to an output node T. The sixth inverter INV6 inverts an output signal of the output node T in order to output a high voltage detection signal ppe.

Since the internal voltage generation control signal Vgen_ctrl is connected to a gate of the first NMOS transistor MN1, the high voltage detector is disabled if the internal voltage generation control signal Vgen_ctrl is activated as a logic high level.

As described above, the semiconductor memory device in accordance with the present invention can save power during the self refresh operation by disabling an internal voltage generator when the internal voltage generator is not needed.

The present application contains subject matter related to Korean patent application No. 2003-98443, filed in the Korean Patent Office on Dec. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a self refresh request signal generation means which receives a self refresh signal for generating a base periodic signal, a plurality of divided signals and a self refresh request signal, wherein the self refresh request signal generation means includes a frequency division unit includes a plurality of frequency dividers, wherein a first frequency divider of the plurality of frequency dividers receives the base periodic signal in order to generate a first divided signal by doubling a period of the base periodic signal, and a next frequency divider of the plurality of frequency dividers receives an output signal of a previous frequency divider in order to generate a next divided signal by doubling a period of the output signal of the previous frequency divider;
   an internal voltage generation control signal generation means for generating an internal voltage generation control signal in response to the plurality of divided signals; and
   an internal voltage generation means for generating an internal voltage in response to the internal voltage generation control signal,
   wherein the internal voltage generation control signal generation means includes:
   a first logic gate for performing a NAND operation of the base periodic signal and the plurality of divided signals;
   a first inverter for inverting an output signal of the first logic gate;
   a second logic gate for performing a NAND operation of inverted signals of the base periodic signal and the plurality of divided signals;
   a second inverter for inverting an output signal of the second logic gate;
   a third logic gate for performing a NOR operation of output signals of the first inverter and the second inverter; and
   a third inverter which receives an output signal of the third logic gate in order to output the internal voltage generation control signal.

2. The semiconductor memory device as recited in claim 1, wherein the self refresh request signal generation means further includes:
   a unit delay ring oscillator which receives the self refresh signal for generating the base periodic signal; and
   a pulse generator for generating the self refresh request signal in response to the base periodic signal and the plurality of divided signals, wherein the self refresh request signal periodically pulses.

3. The semiconductor memory device as recited in claim 2, wherein the pulse generator includes:
   a fourth logic gate for performing a NAND operation of the base periodic signal and the plurality of divided signals;
   a fourth inverter for inverting an output signal of the fourth logic gate;

a delay unit which receives an output signal of the fourth inverter for delaying the output signal of the fourth inverter for a predetermined delay time;

a fifth logic gate for performing a NAND operation of output signals of the fourth inverter and the delay unit; and a fifth inverter which receives an output signal of the fifth logic gate for outputting the self refresh request signal.

4. The semiconductor memory device as recited in claim 3, wherein the delay unit includes odd numbers of inverters for having the predetermined delay time which corresponds to a pulse width of the self refresh request signal.

5. A semiconductor memory device, comprising:
a self refresh request signal generation means which receives a self refresh signal for generating a base periodic signal, a plurality of divided signals and a self refresh request signal, wherein the plurality of divided signals are generated by frequency dividers, each for doubling a period of an inputted periodic signal;

an internal voltage generation control signal generation means for generating an internal voltage generation control signal in response to the plurality of divided signals; and an internal voltage generation means for generating an internal voltage in response to the internal voltage generation control signal, wherein the internal voltage generation control signal generation means includes:

a first logic gate for performing a NAND operation of the base periodic signal and the plurality of divided signals;

a first inverter for inverting an output signal of the first logic gate;

a second logic gate for performing a NAND operation of inverted signals of the base periodic signal and the plurality of divided signals;

a second inverter for inverting an output signal of the second logic gate;

a third logic gate for performing a NOR operation of output signals of the first inverter and the second inverter; and a third inverter which receives an output signal of the third logic gate in order to output the internal voltage generation control signal.

6. The semiconductor memory device as recited in claim 5, wherein the self refresh request signal generation means includes:

a unit delay ring oscillator which receives the self refresh signal for generating the base periodic signal;

a frequency division unit which receives the base periodic signal for generating the plurality of divided signals by increasing a period of the base periodic signal; and a pulse generator for generating the self refresh request signal in response to the base periodic signal and the plurality of divided signals, wherein the self refresh request signal periodically pulses.

7. The semiconductor memory device as recited in claim 6, wherein the frequency division unit includes the frequency dividers, wherein a first frequency divider of the plurality of frequency dividers receives the base periodic signal in order to generate a first divided signal by doubling a period of the base periodic signal, and a next frequency divider of the plurality of frequency dividers receives an output signal of a previous frequency divider in order to generate a next divided signal by doubling a period of the output signal of the previous frequency divider.

8. The semiconductor memory device as recited in claim 6, wherein the pulse generator includes:

a fourth logic gate for performing a NAND operation of the base periodic signal and the plurality of divided signals;

a fourth inverter for inverting an output signal of the fourth logic gate;

a delay unit which receives an output signal of the fourth inverter for delaying the output signal of the fourth inverter for a predetermined delay time;

a fifth logic gate for performing a NAND operation of output signals of the fourth inverter and the delay unit; and a fifth inverter which receives an output signal of the fifth logic gate for outputting the self refresh request signal.

9. The semiconductor memory device as recited in claim 8, wherein the delay unit includes odd numbers of inverters for having the predetermined delay time which corresponds to a pulse width of the self refresh request signal.

10. A semiconductor memory device, comprising:
a unit delay ring oscillator which receives a self refresh signal for generating a base periodic signal;

a frequency division unit which receives the base periodic signal for generating a plurality of divided signals;

a pulse generator for generating a self refresh request signal in response to the base periodic signal and the plurality of divided signals, wherein the self refresh request signal periodically pulses;

an internal voltage generation control signal generation means for generating an internal voltage generation control signal in response to the plurality of divided signals; and an internal voltage generation means for generating an internal voltage in response to the internal voltage generation control signal, wherein the pulse generator includes:

a first logic gate for performing a NAND operation of the base periodic signal and the plurality of divided signals;

a first inverter for inverting an output signal of the first logic gate;

a delay unit for delaying an output signal of the first inverter for a predetermined delay time;

a second logic gate for performing a NAND operation of output signals of the first inverter and the delay unit; and a second inverter which inverts an output signal of the second logic gate for outputting the self refresh request signal.

11. The semiconductor memory device as recited in claim 10, wherein the frequency division unit includes the frequency dividers, wherein a first frequency divider of the plurality of frequency dividers receives the base periodic signal in order to generate a first divided signal by doubling a period of the base periodic signal, and a next frequency divider of the plurality of frequency dividers receives an output signal of a previous frequency divider in order to generate a next divided signal by doubling a period of the output signal of the previous frequency divider.

12. The semiconductor memory device as recited in claim 10, wherein the delay unit includes odd numbers of inverters for having the predetermined delay time which corresponds to a pulse width of the self refresh request signal.

13. The semiconductor memory device as recited in claim 10, wherein the internal voltage generation control signal generation means includes:

a third logic gate for performing a NAND operation of the base periodic signal and the plurality of divided signals;

a third inverter for inverting an output signal of the third logic gate;

a fourth logic gate for performing a NAND operation of inverted signals of the base periodic signal and the plurality of divided signals;

a fourth inverter for inverting an output signal of the fourth logic gate;

a fifth logic gate for performing a NOR operation of output signals of the third and the fourth inverters; and a fifth inverter for inverting an output signal of the fifth logic gate in order to output the internal voltage generation control signal.

\* \* \* \* \*